United States Patent

[11] 3,613,032

[72] Inventor Charles W. Pond
Costa Mesa, Calif.
[21] Appl. No. 20,950
[22] Filed Mar. 19, 1970
[45] Patented Oct. 12, 1971
[73] Assignee Hughes Aircraft Company
Culver City, Calif.

[54] COMPOSITE CRYSTAL FILTER CIRCUIT
4 Claims, 2 Drawing Figs.

[52] U.S. Cl. ........................................................ 333/72, 333/74
[51] Int. Cl. ........................................................ H03h 9/00
[50] Field of Search ............................................ 333/70, 71, 72, 74; 179/15

[56] References Cited

UNITED STATES PATENTS

| | | | |
|---|---|---|---|
| 3,344,368 | 9/1967 | Fettweis | 333/72 |
| 3,316,510 | 4/1967 | Poschenrieder | 333/72 |
| 3,365,679 | 1/1968 | Matsumoto | 333/28 |
| 2,546,994 | 4/1951 | Fromageot et al. | 179/15 |
| 3,179,906 | 4/1965 | Turvey | 333/72 |
| 3,416,104 | 12/1968 | Argoudelis | 333/72 |

*Primary Examiner*—Herman Karl Saalbach
*Assistant Examiner*—C. Baraff
*Attorneys*—James K. Haskell and Paul M. Coble

ABSTRACT: A single composite crystal filter circuit provides an attenuation versus frequency characteristic which herebefore required a separate band-pass crystal filter, an LC filter, and a band reject crystal filter. The attenuation versus frequency characteristic provides stopband attenuation over a wide frequency range, a passband over a narrow frequency range, and high attenuation at one or more specific frequencies very near an edge of the passband.

Figure 1:
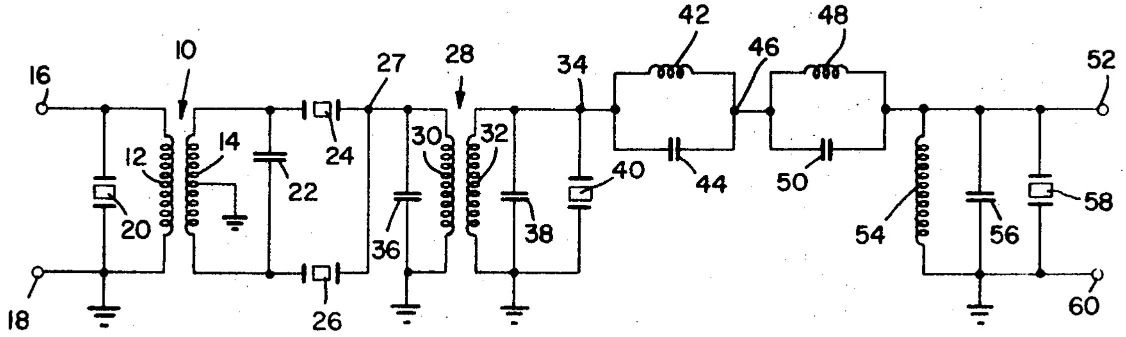

Charles W. Pond,
INVENTOR.
BY.
Paul M. Coble
ATTORNEY.

COMPOSITE CRYSTAL FILTER CIRCUIT

THis invention relates to electronic circuits, and more particularly relates to a composite crystal filter circuit for providing a preselected attenuation versus frequency characteristic which heretofore required a plurality of cascaded individual filters. THe invention herein described was made in the course of or under a contract or subcontract thereunder with the Department of the Navy.

In certain crystal filter applications, an attenuation versus frequency characteristic is desired which provides high attenuation (stopbands) over a wide frequency range, minimum attenuation (a passband) over a narrow frequency range between the stopband ranges, and high attenuation at one or more specific frequencies very near an edge of the passband in order to suppress these frequencies. In the past this type of attenuation versus frequency characteristic was achieved by a plurality of cascaded individual filters. These filters generally included a band-pass crystal filter for shaping the passband region of the characteristic, an LC filter for providing attenuation at frequency ranges remote from the passband, and a band reject crystal filter for providing attenuation at the specific frequencies it was desired to suppress. These filters were normally separately encased and were isolated from each other by active or passive isolation networks.

It is an object of the present invention to provide a single crystal filter circuit which affords the aforementioned type of attenuation versus frequency characteristic with substantially fewer components than the cascaded individual filters of the prior art.

It is a further object of the invention to provide a composite crystal filter capable of achieving the aforementioned type of attenuation versus frequency characteristic and which can be encased in a single housing.

It is a still further object of the invention to provide a novel crystal filter circuit which is smaller, lighter, less costly and more reliable than crystal filter circuits of the prior art which provide a similar attenuation versus frequency characteristic.

In accordance with the foregoing objects, a crystal filter circuit according to the invention includes a first transformer having a primary winding coupled between first and second terminals, and a first crystal resonator coupled in parallel with the primary winding. A first capacitor is coupled in parallel with the transformer secondary winding, while a second crystal resonator and a frequency-sensitive impedance element are coupled in series with one another and in parallel with the first capacitor. A second capacitor is coupled in parallel with the primary winding of a second transformer between the second terminal and the junction between the second crystal resonator and the frequency-sensitive impedance element. A third capacitor and a third crystal resonator are coupled in parallel with the secondary winding of the second transformer. A first inductor and a fourth capacitor are coupled in parallel between an electrode of the third capacitor and a third terminal. A second inductor, a fifth capacitor and a fourth crystal resonator are coupled in parallel between the second and third terminals.

Figure 2:
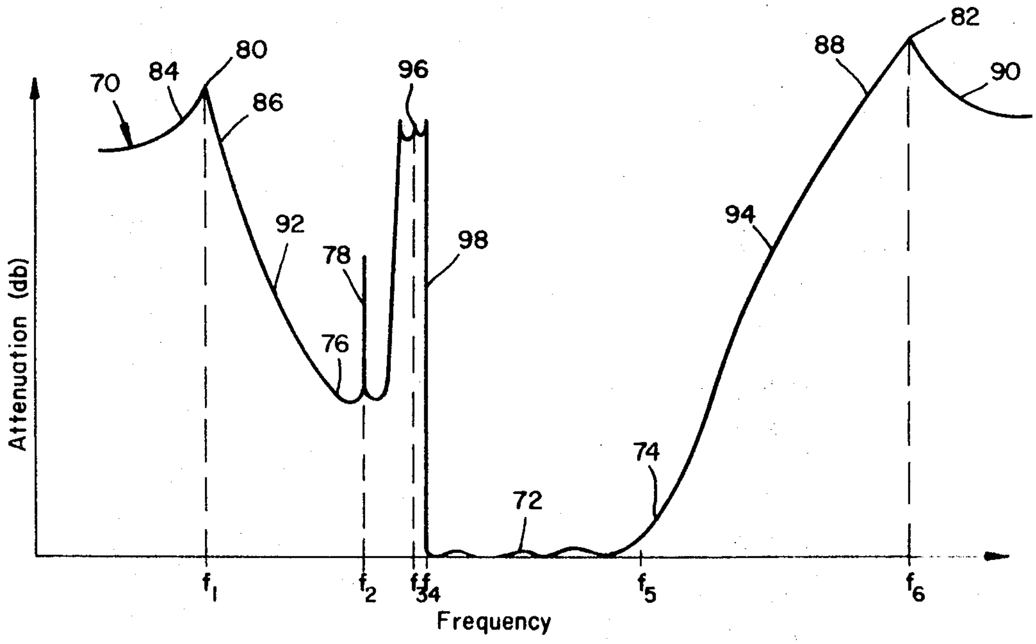

Additional objects, advantages and characteristic features of the invention will become apparent from the following detailed description of a preferred embodiment of the invention when considered in conjunction with the accompanying drawings in which:

FIG. 1 is a schematic circuit diagram illustrating a composite crystal filter circuit in accordance with a preferred embodiment of the invention; and FIG. 2 is a graph showing the attenuation versus frequency characteristic provided by the crystal filter circuit of FIG. 1.

Referring to FIG. 1 with greater particularity, a composite crystal filter circuit in accordance with the invention may be seen to include a first impedance level shifting transformer 10 having a primary winding 12 and a secondary winding 14. The secondary winding 14 has a center tap connected to a level of reference potential illustrated as ground in FIG. 1. The primary winding 12 is connected between a pair of input terminals

16 and 18 for the circuit, the terminal 18 being shown as connected to ground. A crystal resonator 20 is connected between terminals 16 and 18 in parallel with primary winding 12. It should be understood that while only a single crystal resonator is shown, additional crystal resonators may be employed in parallel with the resonator 20 depending upon the particular response characteristic desired.

A capacitor 22 is connected in parallel with transformer secondary winding 14, while respective crystal resonators 24 and 26 are connected between the respective ends of the secondary winding 14 and a junction point 27. Again, additional crystal resonators may be connected in parallel with either or both of the resonators 24 and 26 depending upon the complexity of the desired response characteristic, or for relatively simple characteristics one of the resonators 24 or 26 may be replaced with simpler frequency-sensitive impedance element such as a capacitor. A second impedance level shifting transformer 28 has a primary winding 30 connected between junction point 27 and the ground level. Secondary winding 32 of transformer 28 is connected between a junction point 34 and ground. A capacitor 36 is connected in parallel with primary winding 30, while a capacitor 38 and a crystal resonator 40 are connected in parallel with secondary winding 32.

An inductor 42 and a capacitor 44 are connected in parallel between junction point 34 and a junction point 46, while an additional inductor 48 and capacitor 50 may be connected in parallel between junction point 46 and a circuit output terminal 52. An inductor 54, a capacitor 56 and a crystal resonator 58 are all connected in parallel between output terminal 52 and a terminal 60 connected to the ground level.

The attenuation versus frequency characteristic provided by the filter circuit of FIG. 1 is shown by curve 70 of FIG. 2. It may be seen from this curve that relatively high attenuation is provided through out most of the frequency range depicted, but that minimum attenuation is provided over a frequency passband extending essentially between the passband lower cutoff frequency $f_4$ and the passband upper cutoff frequency $f_5$. High attenuation is provided over a narrow range of frequencies surrounding the frequency $f_3$ which it is desired to suppress, and which frequency is very near the passband lower cutoff frequency $f_4$.

In filter of FIG. 1, the portion of the circuit including transformers 10 and 28, capacitors 22 and 36, and crystal resonators 24 and 26 function as a band-pass crystal filter. The band-pass crystal filter portion of the circuit determines the passband portion 72 of the curve 70 and also primarily determines curve portion 74 corresponding to frequencies just above the passband upper cutoff frequency $f_5$ as well as curve portion 76 corresponding to freuqencies slightly below the passband lower cutoff frequency $f_4$. The band-pass crystal filter portion also introduces an attenuation spike 78 at a frequency $F_2$ which occurs between frequencies corresponding to curve portion 76 and the frequency $F_3$.

Transformer 28 and inductors 42, 48 and 54, and capacitors 38, 44, 50 and 56 function as an LC filter which provides high attenuation at frequency ranges remote from the filter passband region 72. Thus, as shown in FIG. 2, the LC filter portion of the circuit provides an attenuation peak 80 at a frequency $f_1$ substantially below the passband lower cutoff frequency $f_4$ and another attenuation peak 82 at a frequency $f_6$ substantially above the passband upper cutoff frequency $f_5$. Preferably, inductor 42 and capacitor 44 provide a parallel resonance at the frequency $f_1$, and inductor 48 and capacitor 50 provide a parallel resonance at the frequency $f_6$. It is pointed out, however, that where an attenuation peak such as 82 at the frequency $f_6$ is not desired, inductor 48 and capacitor 50 may be omitted and junction point 46 connected directly to output terminal 52.

The LC filter portion also provides relatively high attenuation over frequency ranges surrounding the frequencies $f_1$ and $f_6$ as shown by curve portions 84 and 86 adjacent the peak 80 and curve portions 88 and 90 adjacent the peak 82. Portion 92 of the curve 70 between the curve portions 86 and 76 and portion 94 of the curve 70 between the curve portions 74 and 88 are determined by both the band-pass crystal filter portion and the LC filter portion of the circuit.

The crystal resonators 20, 40 and 58 function as a band reject crystal filter which provides high attenuation, as shown by curve portion 96, over a narrow range of frequencies surrounding the frequency $f_3$ which it is desired to suppress. Each of the crystal resonators 20, 40 and 58 has a series resonant frequency essentially equal to the frequency $F_3$ so as to present an effective short circuit (minimum impedance) to signals at essentially the frequency $f_3$. Moreover, by stagger tuning the series resonant frequencies of the respective crystal resonators 20, 40 and 58 to slightly different frequencies near the frequency $f_3$, the width of the band reject region 96 may be increased.

As may be seen from FIG. 2, the inclusion of the band reject crystal filter portion affords a much steeper sloped curve portion 98 just below the passband lower cutoff frequency $f_4$ than the curve portion 74, 94 just above the upper cutoff frequency $f_5$. This enables signals at the frequency $F_3$ (which is only slightly below the frequency $f_4$) to be attenuated far more than signals at a frequency above the frequency $f_5$ by the same amount (i.e., $f_4$–$f_3$).

It should be appreciated that the composite filter of FIG. 1 provides in a single circuit the combined functions previously performed separately by three individual filters, namely a band-pass crystal filter, an LC filter and a band reject crystal filter. Thus, the need for isolation networks between such individual filters is eliminated, and in addition the entire circuit can be encased in a single housing. Moreover, because of the dual functioning of components such as transformer 28 and the fact that shunt crystal resonators only need be added to the remaining circuitry to provide the band reject function, the circuit of the invention requires substantially fewer components than cascaded individual filters of the prior art which provide a similar overall attenuation versus frequency characteristic. As a result the invention affords savings in size, weight and cost, as well as an improvement in reliability.

Although the invention has been shown and described with reference to a particular embodiment, nevertheless various changes and modifications obvious to a person skilled in the art to which the invention pertains are deemed to lie within the spirit, scope and contemplation of the invention.

What is claimed is:

1. A crystal filter circuit comprising:

a first transformer having a primary winding and a secondary winding, said primary winding being coupled between first and second terminals; a first crystal resonator coupled between said first and second terminals; a first capacitor coupled in parallel with said secondary winding; a second crystal resonator and a frequency sensitive impedance element coupled in series with one another and in parallel with first capacitor; a second transformer having a primary winding and a secondary winding, said primary winding of said second transformer being coupled between said second terminal and the junction between said second crystal resonator and said frequency sensitive impedance element; a second capacitor coupled in parallel with said primary winding of said second transformer; a third capacitor and a third crystal resonator coupled in parallel with said secondary winding of said second transformer; a first inductor and a fourth capacitor coupled in parallel between an electrode of said third capacitor and a third terminal; a second inductor, a fifth capacitor and a fourth crystal resonator coupled in parallel between said second and third terminals;

said circuit providing minimum attenuation for signals within a preselected frequency passband; and each of said first, third and fourth crystal resonators having a series resonant frequency essentially equal to a frequency near an extremity of said passband.

2. A crystal filter circuit according to claim 1 wherein a third inductor and a sixth capacitor are coupled in parallel between said third terminal and the junction between said first inductor and fourth capacitor electrically remote from said electrode of said third capacitor.

3. A crystal filter circuit according to claim 1 wherein said frequency-sensitive impedance element is a crystal resonator.

4. A crystal filter circuit according to claim 1 wherein said secondary winding of said first transformer has a tap coupled to said second terminal.